United States Patent
Jung et al.

(10) Patent No.: US 12,550,672 B2
(45) Date of Patent: Feb. 10, 2026

(54) SUSCEPTOR AND MANUFACTURING METHOD THEREFOR

(71) Applicants: SAMSUNG ELECTRONICS CO., LTD., Suwon-si (KR); MiCo Ceramics Ltd., Anseong-si (KR)

(72) Inventors: Myungsub Jung, Suwon-si (KR); Jun Won Seo, Anseong-si (KR); Sungyeol Kim, Suwon-si (KR); Sungyong Lim, Suwon-si (KR); Hadong Jin, Suwon-si (KR); Jaehyun Choi, Suwon-si (KR)

(73) Assignees: Samsung Electronics Co., Ltd., Suwon-si (KR); MiCo Ceramics Ltd., Anseong-si (KR)

( * ) Notice: Subject to any disclaimer, the term of this patent is extended or adjusted under 35 U.S.C. 154(b) by 284 days.

(21) Appl. No.: 18/042,577

(22) PCT Filed: Sep. 15, 2020

(86) PCT No.: PCT/KR2020/012407
§ 371 (c)(1),
(2) Date: Feb. 22, 2023

(87) PCT Pub. No.: WO2022/055008
PCT Pub. Date: Mar. 17, 2022

(65) Prior Publication Data
US 2023/0326779 A1    Oct. 12, 2023

(30) Foreign Application Priority Data
Sep. 9, 2020 (KR) .................. 10-2020-0115557

(51) Int. Cl.
*H01L 21/683* (2006.01)
*H01L 21/687* (2006.01)

(52) U.S. Cl.
CPC .... *H01L 21/6833* (2013.01); *H01L 21/68785* (2013.01)

(58) Field of Classification Search
CPC .......................... H01L 21/6833; H02N 13/00
See application file for complete search history.

(56) References Cited

U.S. PATENT DOCUMENTS 6,088,213 A * 7/2000 Herchen ............. C23C 16/4586
257/714
2002/0094591 A1  7/2002 Sill et al.
(Continued)

FOREIGN PATENT DOCUMENTS

JP    2003-258065 A    9/2003
JP    2011119654 A    6/2011
(Continued)

OTHER PUBLICATIONS

Translation of WO 2019/168271. Sep. 6, 2019. (Year: 2019).*
(Continued)

*Primary Examiner* — Thienvu V Tran
*Assistant Examiner* — Christopher J Clark
(74) *Attorney, Agent, or Firm* — Wolf, Greenfield & Sacks, P.C.

(57) ABSTRACT

Disclosed are a susceptor for enabling uniform plasma treatment over the entire surface of a wafer, and a manufacturing method therefor. Provided is the susceptor comprising: a dielectric plate having an upper surface on which a wafer is loaded, and a lower surface facing same; and an inner RF electrode and an outer RF electrode that are buried in the dielectric plate, wherein, with respect to the lower surface, the height of a first plane in which the inner RF electrode is buried is less than the height of a second plane in which the outer RF electrode is buried.

12 Claims, 5 Drawing Sheets

(56) References Cited

U.S. PATENT DOCUMENTS

| | | | |
|---|---|---|---|
| 2008/0073032 A1 | 3/2008 | Koshiishi et al. | |
| 2009/0314433 A1 | 12/2009 | Hoffman et al. | |
| 2011/0096461 A1* | 4/2011 | Yoshikawa | H01L 21/6833 |
| | | | 361/234 |
| 2013/0107415 A1 | 5/2013 | Banna et al. | |
| 2014/0231019 A1 | 8/2014 | Kajihara | |
| 2017/0040198 A1* | 2/2017 | Lin | H01L 21/67103 |
| 2021/0166915 A1 | 6/2021 | Hammond et al. | |

FOREIGN PATENT DOCUMENTS

| | | | |
|---|---|---|---|
| JP | 5233092 B2 | 4/2013 | |
| KR | 20140065016 A | 5/2014 | |
| KR | 20200116533 A | 10/2020 | |
| WO | 2013062833 A1 | 5/2013 | |
| WO | 2019169102 A1 | 9/2019 | |
| WO | WO-2019168271 A1 * | 9/2019 | C23C 16/46 |

OTHER PUBLICATIONS

"International Search Report and Written Opinion of the International Searching Authority (with English language translation of ISR)", International Application No. PCT/KR2020/012407, Jun. 7, 2021, 10 pp.

* cited by examiner

SUSCEPTOR AND MANUFACTURING METHOD THEREFOR

RELATED APPLICATIONS

This application is a 35 U.S.C. § 371 national stage application of PCT Application No. PCT/KR2020/012407, filed on Sep. 15, 2020, which claims priority from Korean Patent Application No. 10-2020-0115557, filed on Sep. 9, 2020, the contents of which are incorporated herein by reference in their entireties. The above-referenced PCT International Application was published in the Korean language as International Publication No. WO 2022/055008 A1 on Mar. 17, 2022.

TECHNICAL FIELD

The present disclosure relates to a susceptor and a manufacturing method therefor, and relates to a susceptor capable of uniform plasma treatment over an entire surface of a wafer, and a manufacturing method therefor.

BACKGROUND ART

In a semiconductor device manufacturing process, various processes such as a film formation process, an etching process, or the like are performed on a semiconductor wafer, a process target. In a semiconductor manufacturing apparatus processing the semiconductor wafer, a susceptor for supporting the semiconductor wafer is used. In the susceptor, a conductor such as a radio frequency (RF) electrode, a clamping electrode, and/or a resistance heating element is formed within a body formed of a ceramic material such as aluminum nitride or on a surface of the substrate to function as a heater and/or an electrostatic chuck.

FIG. 1 is a schematic diagram illustrating an example of a susceptor according to the related art.

Referring to FIG. 1, the susceptor 1 includes a plate 10 supporting a wafer. The plate 10 may be formed of a dielectric material such as aluminum nitride. RF electrodes 12A and 12B and a heating element 14 may be provided within the dielectric plate 10.

FIG. 1 has an inner circular RF electrode 12A positioned closer to a dielectric plate surface, and an outer annular RF electrode 12B positioned farther from the plate surface. The circular RF electrode 12A and the annular RF electrode 12B are provided with terminals for power supply and lead wires 16A, 16B and 16C. According to the structure of FIG. 1, the annular RF electrode 12B is disposed below the circular RF electrode 12A, thereby removing interference between terminals and rendering potential uniform in an RF electrode so as to suppress variations in plasma density.

However, in a multilayer susceptor according to the related art illustrated in FIG. 1, the outer RF electrode is positioned below the inner RF electrode to apply power to the outer RF. Due to such a structural issue, configurations for designs and layers of the inner and outer RF electrodes are limited.

In particular, when a pocket-type susceptor is manufactured, plasma control is difficult because an upper dielectric thickness (UDT) of the inner RF electrode is different from an upper dielectric layer thickness (UDT) of the outer RF electrode. For example, in order to implement the same plasma density, it is necessary to take measures such as applying a frequency to each RF electrode.

In order to resolve such an issue, a susceptor having a design in which a loading surface of a wafer of the susceptor is designed to be high has been developed. However, the susceptor is limited to have a special design providing a step on the loading surface of the wafer. In addition, it is necessary to fasten an additional part to the outside of a ceramic heater in order to prevent wafer sliding.

SUMMARY OF INVENTION

Technical Problem

An aspect of the present disclosure is to provide a susceptor capable of uniform plasma control.

Another aspect of the present disclosure is to provide a susceptor improving deposition uniformity of a wafer by preventing edge lifting of the wafer caused by gas flow during a process.

Another aspect of the present disclosure is to provide a pocket-type susceptor having a multilayer RF electrode.

Another aspect of the present disclosure is to provide an electrode structure suitable for a structure of a pocket-type susceptor.

Another aspect of the present disclosure is to provide a method for manufacturing the above-described susceptor.

Solution to Problem

In order to achieve the above technical problem, the present disclosure provides a susceptor including a dielectric plate having an upper surface on which a wafer is loaded, and a lower surface opposite the upper surface, and an inner RF electrode and an outer RF electrode that are buried in the dielectric plate, wherein, with respect to the lower surface, a height of a first plane in which the inner RF electrode is buried is less than a height of a second plane in which the outer RF electrode is buried.

In the present disclosure, the upper surface includes a first surface on which a wafer is loaded and a second surface surrounding the first surface, and a height of the first surface may be lower than a height of the second surface with respect to the lower surface.

At this time, a first upper dielectric layer thickness (udt1) from the first plane to the first surface may be substantially the same as a second upper dielectric layer thickness (udt2) from the second plane to the second surface.

Conversely, a first upper dielectric layer thickness (udt1) from the first plane to the first surface and a second upper dielectric layer thickness (udt2) from the second plane to the second surface may satisfy a relationship of $-0.5<(udt1-udt2)/udt1<0.5$.

In the present disclosure, a ratio of an electrode gap ($\delta$) defined as a difference between an inner circumference radius (r3) of the outer RF electrode and a radius (r1) of the inner RF electrode with respect to a radius (r1) of an inner electrode may satisfy a relationship of $-0.9 \leq r3/r1 \leq 1.0$.

In the present disclosure, the inner RF electrode and the outer RF electrode are one of a sheet-type or a mesh-type.

In addition, the present disclosure may include a connection member for power supply to the outer RF electrode. At this time, the connection member is one of a sheet-type or a rod-type.

In addition, the susceptor according to the present disclosure may further include a heating element disposed within the plate. In addition thereto or aside therefrom, the susceptor according to the present disclosure may further include a clamping electrode disposed within the plate.

In the present disclosure, a height difference between the first plane and the second plane may be 0.1 to 2.0 mm.

Advantageous Effects of Invention

According to the present disclosure, there may be provided a susceptor capable of uniform plasma control.

In addition, according to the present disclosure, there may be provided a susceptor improving deposition uniformity of a wafer by preventing edge lifting of the wafer caused by gas flow during a process.

In addition, the present disclosure may provide a multilayer RF electrode structure suitable for a pocket-type susceptor.

BEST MODE FOR INVENTION

Figure 1:
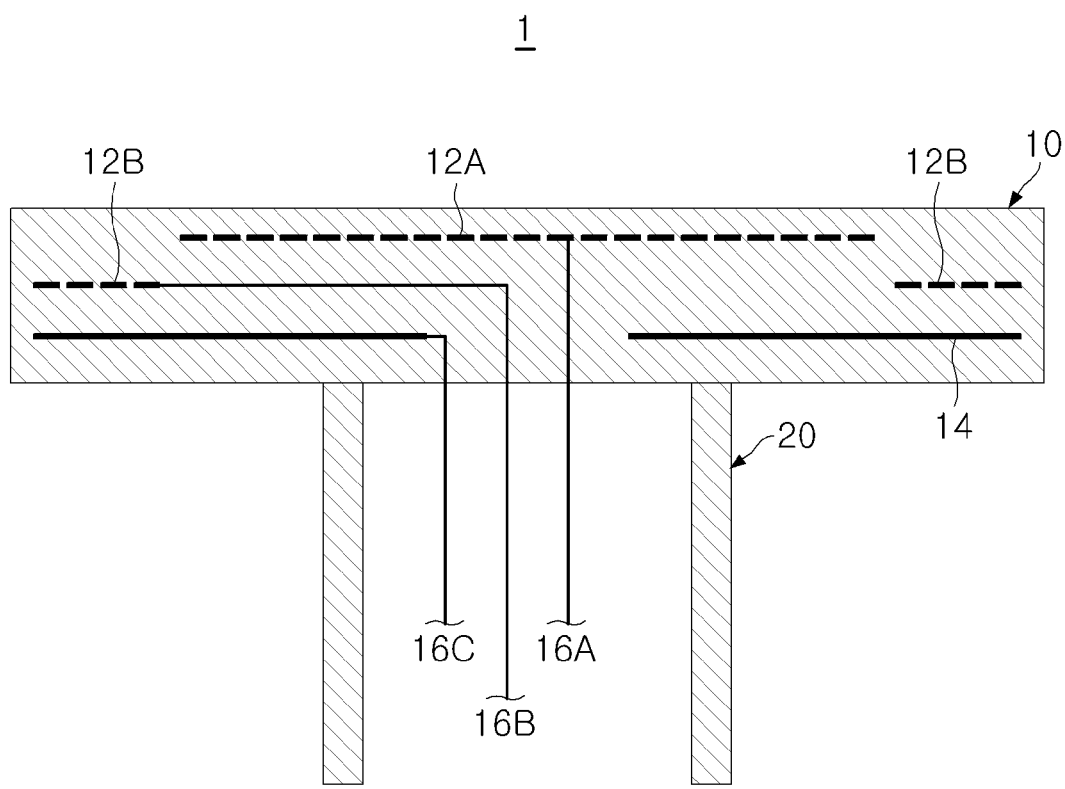
FIG. 1 is a diagram illustrating an example of a susceptor according to an example embodiment of the present disclosure.

The Hereinafter, the present disclosure will be described in detail with reference to the accompanying drawings. In this case, it should be noted that the same components are denoted by the same reference numerals in the accompanying drawings. In addition, detailed descriptions of well-known functions and configurations that may obscure the gist of the present disclosure will be omitted. For the same reason, some components are exaggerated, omitted, or schematically illustrated in the accompanying drawings, and the size of each component does not fully reflect the actual size. Therefore, the contents described herein are not limited by the relative size or spacing of the components drawn in each drawing.

In addition, in the present disclosure, "stack" is used to define a relative positional relationship between respective layers. The description "layer B on layer A" indicates a relative positional relationship between layer A and layer B, and it is not required that layer A and layer B come into contact with each other, and a third layer may be interposed therebetween. Similarly, the description "layer C is interposed between layer A and layer B" does not exclude the case in which a third layer is interposed between layer A and layer C or between layer B and layer C.

Figure 2A:
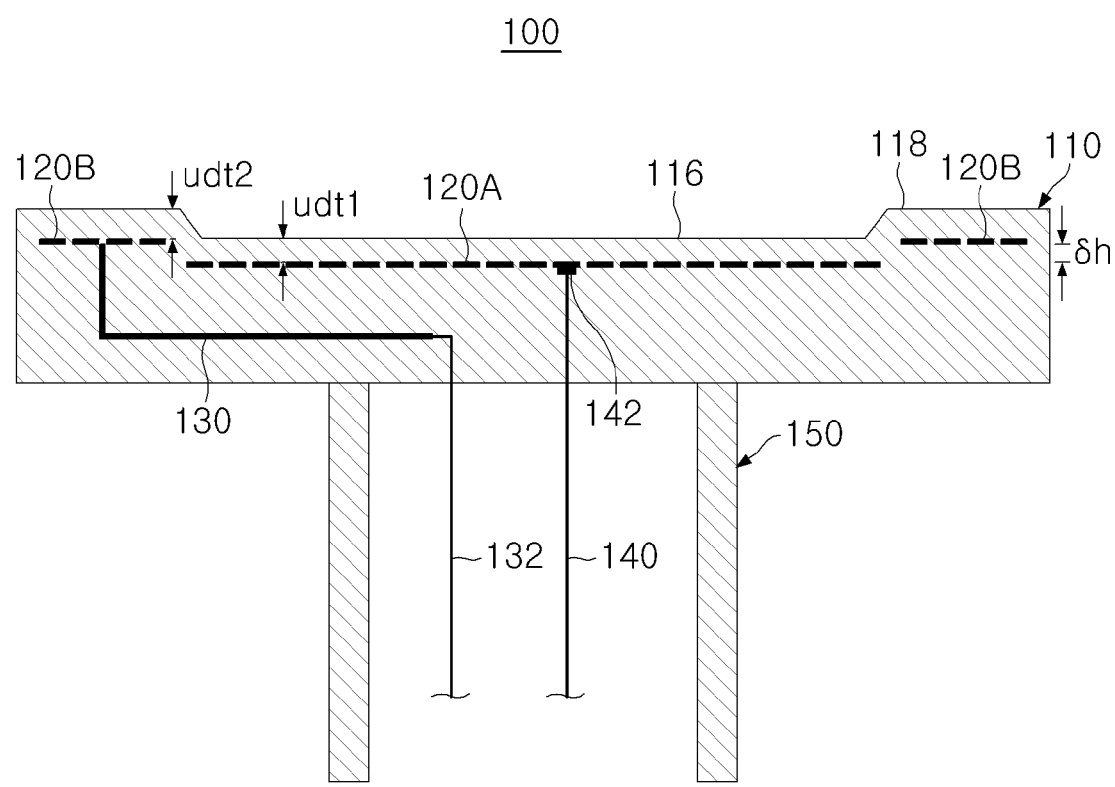
FIGS. 2A and 2B are respectively a schematic cross-sectional view and a schematic plan view illustrating an electrode structure of a susceptor according to an example embodiment of the present disclosure.
Figure 2B:
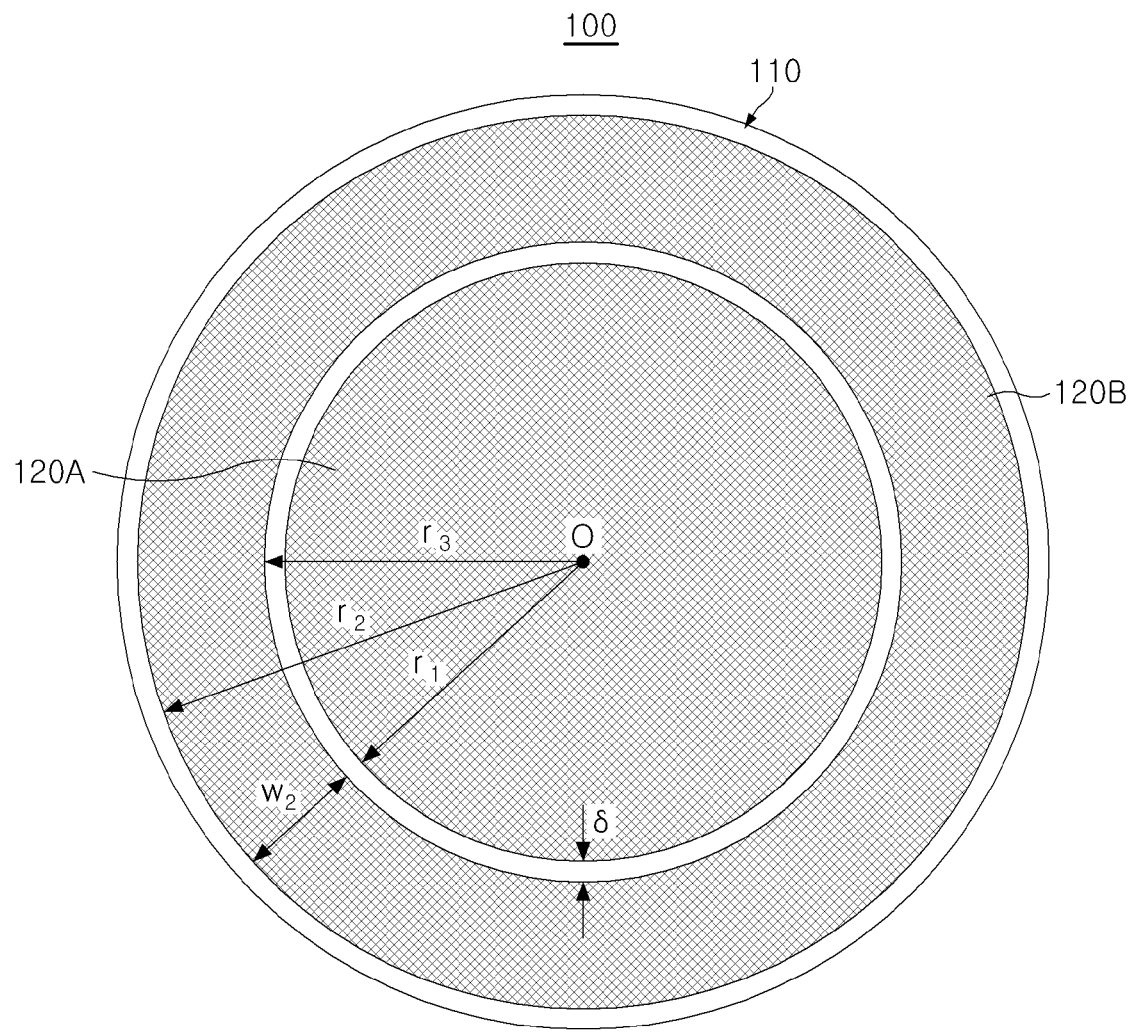

FIGS. 2A and 2B are a schematic cross-sectional view and a schematic plan view illustrating an electrode structure of a susceptor according to an example embodiment of the present disclosure.

Referring to FIGS. 2A and 2B, the susceptor 100 includes a plate 110 on which a pocket-type wafer loading surface 116 is formed. The plate 110 may be formed of a dielectric material such as AlN. The dielectric plate 110 has an upper surface, which is a side supporting a wafer, and a lower surface, which is an opposite side, facing the upper surface.

The upper surface has at least two surfaces including a loading surface 116, which is a first surface on which a wafer is loaded, and an outer circumferential surface 118, which is a second surface adjacent to the wafer loading surface and surrounding the wafer loading surface.

An inner RF electrode 120A and an outer RF electrode 120B are provided within the susceptor. In the present disclosure, the RF electrodes 120A and 120B are preferably buried in a dielectric plate, but is not necessarily limited thereto. In the present disclosure, the inner RF electrode and the outer RF electrode may be a mesh-type or sheet-type.

A connection member 142 and/or a lead 140 may be provided to supply power to the inner RF electrode 120A. A connection member 130 and/or a lead 132 may be provided to supply power to the outer RF electrode 120B. The connection member and the leads 130 and 132 may pass through the inside of the support member 150 to be connected to a power supply means. FIG. 2A illustrates one connection member 130 being formed on the outer RF electrode 120B. However, a plurality of connection members may also be formed on the outer RF electrode 120B.

In the present disclosure, the inner RF electrode 120A may have a shape corresponding to a shape of a wafer or a wafer mounting surface. Preferably, the outer circumferential shape of the internal RF electrode 120A is planarly circular. In addition, the inner RF electrode 120A may have a cylindrical shape in general, but may be divided into a plurality of regions, and each divided segment may have an arc shape having a predetermined angle.

In the present disclosure, the outer RF electrode 120B may planarly have an annular shape having a width of w. In the present disclosure, a width of the outer RF electrode 120B is preferably a constant value along a circumference thereof, but is not limited thereto.

As illustrated in FIG. 2B, the inner RF electrode and the outer RF electrode may be disposed to have a concentric structure. In addition, the drawing illustrates that the inner RF electrode and the outer RF electrode do not overlap on a plane, but the present disclosure is not limited thereto. Depending on required plasma distribution, the inner RF electrode and the outer RF electrode may be present on different planes in a plate, and thus may planarly overlap. Therefore, in the present disclosure, the descriptions "inner" and "outer" may be defined as sizes of outer radii (r1 and r2) on concentric circles of respective electrodes.

In the present disclosure, a difference value between an inner circumferential radius (r3) of an outer electrode and a radius (r1) of an inner electrode may be defined as an electrode gap ($\delta$). When the outer electrode and the inner electrode are not concentric circles, the electrode gap may be defined as an average value. In the present disclosure, the electrode gap may have a positive value or a negative value.

In the present disclosure, a ratio of the electrode gap ($\delta$) to the radius (r1) of the inner electrode may be appropriately designed. When overlapping electrodes are allowed, the ratio may preferably have a value of $0.8 \leq r3/r1 \leq 1.0$, more preferably $0.9 \leq r3/r1 \leq 1.0$. When the electrodes do not overlap, the ratio may preferably have a value of 1<r3/r1<1.2, more preferably 1≤r3/r1<1.1. r1 preferably does not exceed r2.

In the present disclosure, the inner RF electrode 120A and the outer RF electrode 120B are disposed on different planes. Specifically, a plane on which the outer RF electrode is disposed is higher than a plane on which the inner RF electrode is disposed by δh (δh>0). In the present disclosure, δh is preferably 0.1 to 2.0 mm.

A vertical arrangement relationship between the inner and outer RF electrodes may be defined as an upper dielectric layer thickness (udt), which refers to a distance from a plane on which the electrodes are positioned to a surface of the dielectric plate 110 thereon. A plane distance between a plane on which the inner RF electrode is disposed and the loading surface 116 may be represented by udt1, and a plane distance between a plane on which the outer RF electrode is disposed and the outer circumferential surface 118 is represented by udt2. In the present disclosure, a difference between udt1 and udt2 is limited to have a value within a predetermined range, and the difference between udt1 and udt2 is preferably close to zero. Preferably, udt1 and udt2 may satisfy a relationship of −1<(udt1−udt2)/udt1<1, −0.9<(udt1−udt2)/udt1<0.9, −0.8<(udt1−udt2)/udt1<0.8, −0.7<(udt1−udt2)/udt1<0.7, −0.6<(udt1−udt2)/udt1<0.6, −0.5<(udt1−udt2)/udt1<0.5, −0.4<(udt1−udt2)/udt1<0.4, −0.3<(udt1−udt2)/udt1<0.3, −0.2<(udt1−udt2)/udt1<0.2, or −0.1<(udt1−udt2)/udt1<0.1.

As such, the upper dielectric layer thickness may have substantially the same value, thereby allowing plasma to be uniformly distributed on the outer circumferential surface. Such uniform plasma distribution provides various advantages. For example, it is possible to provide an advantage of uniform film formation in the vicinity of a wafer edge on a susceptor.

Although not additionally described, the susceptor according to the present disclosure may further include a heating element and/or a clamping electrode disposed within a plate. The heating element and the clamping electrode may be disposed in an appropriate position above or below the RF electrode.

Mode for Invention

Hereinafter, a method for implementing a susceptor according to an example embodiment of the present disclosure will be described with reference to the drawings.

Various methods may be applied to form two RF electrodes present on different planes. As an example, FIGS. 3 and 4 are diagrams illustrating a process of manufacturing a susceptor using pre-sintering.

Figure 3:
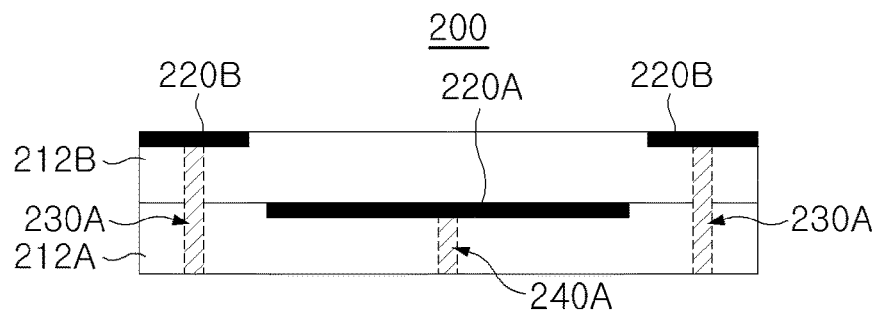
FIG. 3 is a schematic diagram illustrating a cross section of a pre-sintered susceptor precursor according to an example embodiment of the present disclosure.
Figure 4:
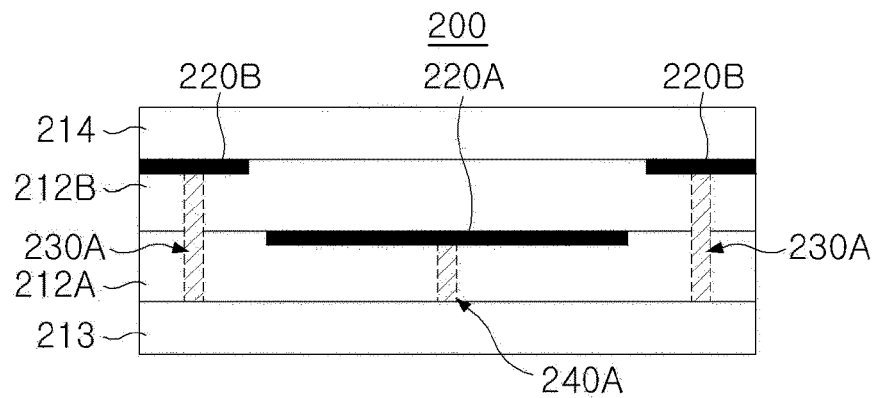
FIG. 4 is a schematic diagram illustrating a cross section of a susceptor precursor in a state in which a molded body is stacked on a pre-sintered body of FIG. 3.

FIG. 3 is a schematic diagram illustrating a cross section of a pre-sintered susceptor precursor 200, and FIG. 4 is a schematic diagram illustrating a cross section of the susceptor precursor 200 in a state in which a molded body is stacked on a pre-sintered body.

Referring to FIG. 3, the susceptor precursor 200 has a structure in which a lower pre-sintered body 212A and an upper pre-sintered body 212B are stacked. An inner RF electrode 220A is formed on the lower pre-sintered body 212A, and an outer RF electrode 220B is formed on the upper pre-sintered body 220B. Electrode connection members 230A and 240A for power supply are provided on the inner RF electrode and the outer RF electrode. There is an advantage in that the susceptor precursor 200 may adjust a height of an RF electrode by a thickness of the pre-sintered body.

FIG. 4 illustrates a state in which molded bodies 213 and 214 are stacked on an upper portion and a lower portion of the stacked pre-sintered bodies 212A and 212B of FIG. 3. A portion or all of the molded bodies 213 and 214 may also be replaced with molded powder. As illustrated in FIG. 4, raw material powder in a stacked state may be manufactured into a sintered body through a sintering process such as a hot press process, and finally the susceptor illustrated in FIGS. 2A and 2B may be manufactured through a subsequent processing process.

Although securing a distance between electrodes using a multilayer or multistage pre-sintered body is described above with reference to FIGS. 3 and 4, the present disclosure may be implemented in other manners.

Figure 5:
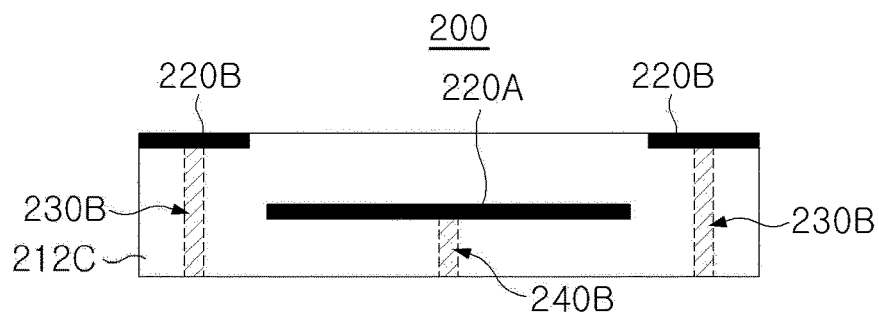
FIG. 5 is a schematic diagram illustrating a cross section of a pre-sintered susceptor precursor according to another example embodiment of the present disclosure.
Figure 6:
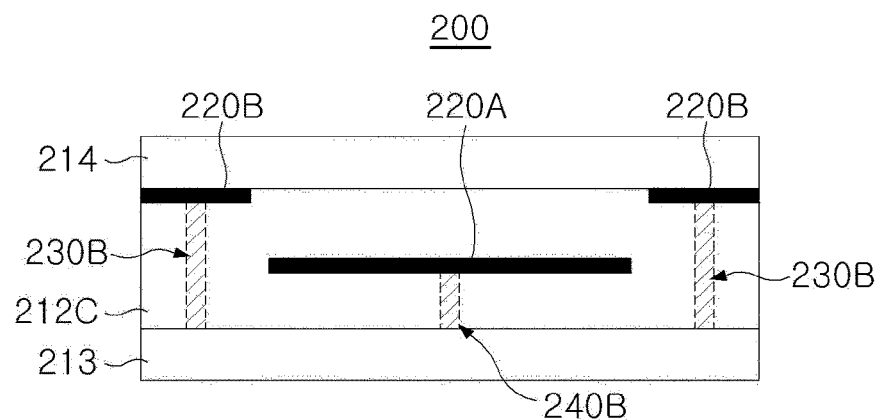
FIG. 6 is a schematic diagram illustrating a cross section of a susceptor precursor in a state in which a molded body is stacked on a pre-sintered body of FIG. 5.

Referring to FIGS. 5 and 6, a manufacturing process according to another example embodiment of the present disclosure will be described. FIG. 5 is a schematic diagram illustrating a cross section of the pre-sintered susceptor precursor 200, and FIG. 6 is a schematic diagram illustrating a cross section of the susceptor precursor 200 in a state in which a molded body is stacked on a pre-sintered body. Unlike FIG. 3, the susceptor precursor 200 of FIG. 5 includes a single pre-sintered body 212C. An inner RF electrode is buried in the single pre-sintered body 212C, and an outer RF electrode is installed on an upper portion of the single pre-sintered body 212C. In addition, connection members 230B and 240B for applying power to the RF electrodes may be provided. The terminals may be manufactured by various manners, such as a process of inserting a terminal formed of a metal material after processing the pre-sintered body, or by a process of burying a connection member formed of a metal material before manufacturing the pre-sintered body, and then performing a pre-sintering.

Subsequently, as illustrated in FIG. 6, the susceptor may be manufactured by stacking molded bodies (or molded body powders) 213 and 214 on the upper portion and lower portion of the pre-sintered body 212C, and then performing a hot press process.

FIGS. 7A to 7E are diagrams specifically illustrating an example of a process of manufacturing a stacked pre-sintered body of FIG. 3 according to an example embodiment of the present disclosure.

Figure 7A:
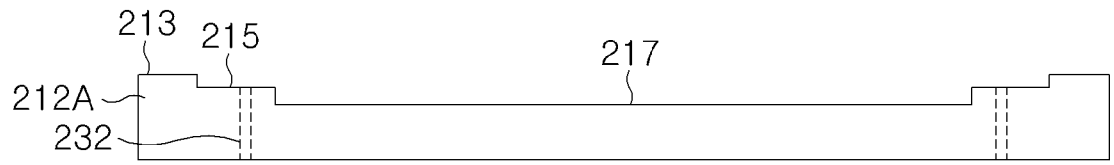
FIGS. 7A to 7E are diagrams specifically illustrating an example of a process of manufacturing a stacked pre-sintered body of FIG. 3 according to an example embodiment of the present disclosure.

First, referring to FIG. 7A, the lower pre-sintered body 212A is provided. The lower pre-sintered body 212A has a plurality of stepped surface structures 213, 215, and 217. A central groove 217 corresponds to a position in which an inner RF electrode is formed, and an outermost groove 213 and an intermediate groove 215 act as a fixing frame for stacking an upper pre-sintered body.

The above-described stepped surface structures 213, 215, and 217 may be obtained by performing surface-processing on a pre-sintered body in an appropriate manner. A hole 232 for a connection member for an RF electrode is provided in the lower pre-sintered body 212A. Although not illustrated, a hole for a connection member for an inner RF electrode may be provided.

Figure 7B:

Subsequently, as illustrated in FIG. 7B, an inner RF electrode is formed in the central groove 217. Various methods such as a method of disposing a metal electrode processed along a shape of the central groove 217, a printing method such as screen printing using a slurry of conductive metal particles, and the like may be applied for the formation of the inner RF electrode.

Figure 7C:

Subsequently, as illustrated in FIG. 7C, the upper pre-sintered body 212B is stacked on the lower pre-sintered body 212A. The upper pre-sintered body 212B has a groove 218 corresponding to a position in which an outer RF electrode is formed. In addition, in the pre-sintered body 212B, a hole 232 is formed to extend for a connection member for an outer RF electrode. The above-described method of forming the hole 232 for the connection member for an outer RF electrode is exemplary. The hole 232 for the connection member may be formed after the upper and lower pre-sintered bodies are stacked.

Figure 7D:
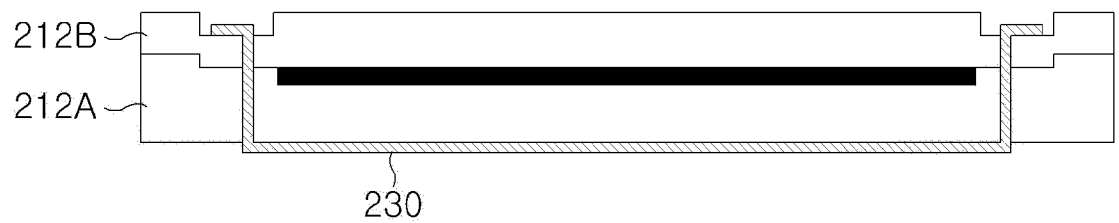

Subsequently, as illustrated in FIG. 7D, a connection member 230 is formed by inserting, into the hole 232 for an outer RF electrode, a metal member processed to have a "C" shape. At this time, the connection member 230 may be in the form of a thin and long plate processed to have a "C" shape or a rod having a circular or polygonal cross section. The connection member 230 is inserted into the hole 232 for the electrode, and then is bent in the groove 218 for forming an outer RF electrode.

Figure 7E:
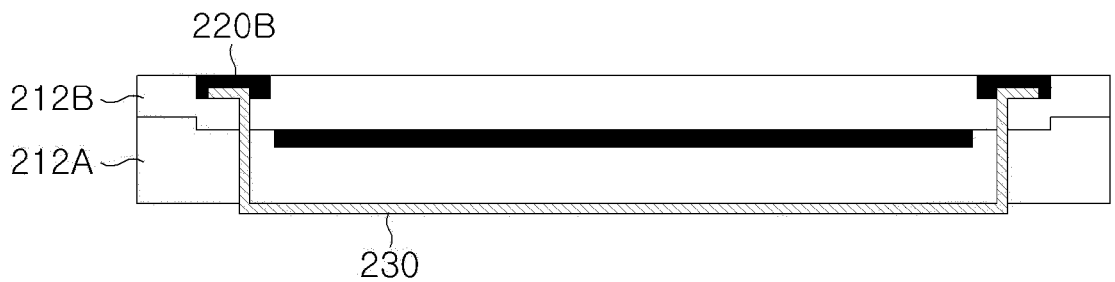

Subsequently, as illustrated in FIG. 7E, the outer RF electrode may be formed by disposing a processed metal electrode in the hole 232 for the electrode or by a printing method such as screen printing using a slurry of conductive metal particles, thereby preparing a susceptor precursor, as illustrated in FIG. 3.

EXAMPLES

A film formation test was conducted using a ceramic heater meeting the following standard.
  A. RF Electrode and Heating Element Electrode of Susceptor
  RF Electrode: Mesh Type, and Thickness of 0.6 mm
  Heating Element Electrode: Coil Type, and Wire Thickness of 0.6 mm
  B. CVD Process Conditions
  Film-Forming Thickness Target: 1800 Å
  Heater Target Temperature: 550° C.
  Pressure: 7200 mTorr
  RF Power: 1600 W
  Gas and Flow: N2 500 sccm, C3H6 1000 sccm, Ar 300 sccm, He 800 sccm Table 1 is a table showing specifications of and film formation results of RF electrodes when udts of the RF electrodes are the same, and Table 2 is a table showing specifications and film formation results of the RF electrodes when the udts of the RF electrodes are different from each other.

TABLE 1

| Sample No. | δh | Udt1 | Udt2 | Film Formation Variation (%) | Notes |
|---|---|---|---|---|---|
| #1 | 0.05 | 2 mm | 2 mm | 6.20% | Poor |
| #2 | 0.1 | 2 mm | 2 mm | 2.10% | Good |
| #3 | 1 | 2 mm | 2 mm | 1.80% | Good |
| #4 | 2 | 2 mm | 2 mm | 1.80% | Good |
| #5 | 3 | 2 mm | 2 mm | 5.20% | Poor |

TABLE 2

| Sample No. | δh | Udt1 | Udt2 | Film Formation Variation (%) | Notes |
|---|---|---|---|---|---|
| #1 | 1 | 2 mm | 3 mm | 3.50% | Normal |
| #2 | 2 | 2 mm | 3 mm | 3.21% | Normal |
| #3 | 1 | 2 mm | 4 mm | 5.80% | Poor |
| #4 | 2 | 2 mm | 4 mm | 5.58% | Poor |
| #5 | 1 | 2 mm | 5 mm | 12.20% | Poor |
| #6 | 2 | 2 mm | 5 mm | 14.20% | Poor |

While the present disclosure has been described in conjunction with specific details, such as specific components, and limited example embodiments and drawings above, the example embodiments and drawings are provided merely to help an overall understanding of the present disclosure. The present disclosure is not limited to the above-described example embodiments, and various modifications and alterations can be made based on the foregoing description by those skilled in the art to which the present disclosure pertains. Therefore, the technical spirit of the present disclosure should not be determined based only on the described example embodiments, and the following claims, all equivalents to the claims and equivalent modifications should be construed as falling within the scope of the spirit of the present disclosure.

INDUSTRIAL APPLICABILITY

The present disclosure is usable for a ceramic heater and/or a susceptor such as an electrostatic chuck used for manufacturing a semiconductor or the like.

The invention claimed is:

1. A susceptor comprising:
  a dielectric plate including an upper surface on which a wafer is loaded, and a lower surface opposite the upper surface, wherein the dielectric plate comprises an upper pre-sintered body stacked on a lower pre-sintered body, wherein the lower pre-sintered body comprises a plurality of stepped surface structures that serve as a fixing frame for stacking the upper pre-sintered body; and
  an inner RF electrode formed on the lower pre-sintered body and an outer RF electrode formed on the upper pre-sintered body;
  a connection member for power supply to the outer RF electrode, wherein the connection member is in the form of an elongate plate processed to have a "C" shape,
  wherein, with respect to the lower surface, a height of a first plane at which the inner RF electrode is located is less than a height of a second plane at which the outer RF electrode is located.

2. The susceptor of claim 1, wherein
  the upper surface includes a first surface on which a wafer is loaded and a second surface surrounding the first surface, and
  a height of the first surface is lower than a height of the second surface with respect to the lower surface.

3. The susceptor of claim 2, wherein a first upper dielectric layer thickness (udt1) from the first plane to the first surface is substantially the same as a second upper dielectric layer thickness (udt2) from the second plane to the second surface.

4. The susceptor of claim 2, wherein a first upper dielectric layer thickness (udt1) from the first plane to the first surface and a second upper dielectric layer thickness (udt2) from the second plane to the second surface satisfy a relationship of $-0.5 < (udt1-udt2)/udt1 < 0.5$.

5. The susceptor of claim 3, wherein a ratio of an electrode gap (δ) defined as a difference between an inner circumference radius (r3) of the outer RF electrode and a radius (r1)

of the inner RF electrode with respect to a radius (r1) of an inner electrode satisfies a relationship of 0.9≤r3/r1≤1.0.

6. The susceptor of claim 1, wherein the inner RF electrode and the outer RF electrode are one of a sheet-type or a mesh-type.

7. The susceptor of claim 1, wherein the connection member is one of a sheet-type or a rod-type.

8. The susceptor of claim 1, further comprising:
a heating element disposed within the plate.

9. The susceptor of claim 1, further comprising:
a clamping electrode disposed within the plate.

10. The susceptor of claim 1, wherein a height difference between the first plane and the second plane is 0.1 to 2.0 mm.

11. The susceptor of claim 4, wherein a ratio of an electrode gap 8 defined as a difference between an inner circumference radius (r3) of the outer RF electrode and a radius (r1) of the inner RF electrode with respect to a radius (r1) of an inner electrode satisfies a relationship of 0.9≤r3/r1≤1.0.

12. The susceptor of claim 1, wherein opposite end portions of the connection member are bent.

\* \* \* \* \*